(12) United States Patent
Yamaguchi et al.

(10) Patent No.: US 6,665,931 B2
(45) Date of Patent: Dec. 23, 2003

(54) WIRING METHOD FOR FORMING CONDUCTOR WIRE ON A SUBSTRATE BOARD

(75) Inventors: Shigeo Yamaguchi, Hiratsuka (JP); Masaaki Arahori, Hiratsuka (JP); Toshio Yamamoto, Narashino (JP); Toshimitsu Nishiwaki, Ichihara (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 268 days.

(21) Appl. No.: 09/755,749

(22) Filed: Jan. 5, 2001

(65) Prior Publication Data

US 2001/0011413 A1 Aug. 9, 2001

Related U.S. Application Data

(63) Continuation of application No. PCT/JP00/02880, filed on May 1, 2000.

(30) Foreign Application Priority Data

| May 7, 1999 | (JP) | 11-126988 |
| Aug. 13, 1999 | (JP) | 11-229171 |
| Sep. 9, 1999 | (JP) | 11-255856 |
| Sep. 13, 1999 | (JP) | 11-259069 |

(51) Int. Cl.$^7$ .............................................. H01K 3/10
(52) U.S. Cl. ............................. 29/850; 29/600; 29/601; 29/33 F; 29/748
(58) Field of Search .................... 29/600, 606, 843, 29/827, 33 F, 748, 745, 832, 825, 850, 846, 601; 235/380, 382

(56) References Cited

U.S. PATENT DOCUMENTS

| 5,584,121 A | * | 12/1996 | Arike et al. | 29/850 |
| 6,088,230 A | * | 7/2000 | Finn et al. | 361/737 |
| 6,233,818 B1 | * | 5/2001 | Finn et al. | 29/843 |
| 2001/0011413 A1 | * | 8/2001 | Yamaguchi et al. | 29/600 |

FOREIGN PATENT DOCUMENTS

| EP | 0 674 328 A1 | 9/1995 |
| JP | 06-120665 | 4/1994 |
| JP | 08-294213 | 11/1996 |
| JP | 10-193851 | 7/1998 |
| JP | 11-119034 | * 4/1999 |

OTHER PUBLICATIONS

Copy of European Search Report; Application No. 00922938.6–2214–JP0002880, dated Jun. 5, 2002.

* cited by examiner

*Primary Examiner*—Peter Vo
*Assistant Examiner*—Minh Trinh
(74) *Attorney, Agent, or Firm*—Knobbe, Martens, Olson & Bear, LLP

(57) ABSTRACT

A wiring method is provided, in which a wire conductor is stuck on a surface of a substrate by causing a three-dimensional relative movement between a wiring head for guiding the wire conductor and the substrate such that the wiring head relatively moves along an adhesive layer on the surface of the substrate and the wiring head and the adhesive layer intermittently come close to each other for point contact.

6 Claims, 5 Drawing Sheets

WIRING METHOD FOR FORMING CONDUCTOR WIRE ON A SUBSTRATE BOARD

CROSS REFERENCE TO RELATED APPLICATIONS

This application is a continuation of PCT application No. PCT/JP00/02880, filed on May 1, 2000.

TECHNICAL FIELD

The present invention relates to a wiring method and a wiring apparatus, and more particularly, to a wiring method and a wiring apparatus capable of easily forming a coil on an insulating substrate and easily laying a wire conductor on a circuit board or circuit substrate. The present invention also relates to an IC card manufacturing method capable of easily manufacturing an IC card provided with a chip module and/or an antenna coil, using the wiring method and/or wiring apparatus of the above kind.

BACKGROUND ART

Recently, the demand to reduce the heights of various components installed in an electric apparatus has been increasing. To meet such a demand, a coil serving as a transformer, a filter or the like may be configured in the form of a so-called "planar coil". The planar coil of this type is conventionally manufactured by subjecting a conductive plate or film to etching or mechanical punching or by winding an enameled wire two-dimensionally. However, there are many problems that hinder manufacturing a planar coil of desired properties at low cost and with high yield.

For example, according to the technique disclosed in Japanese Patent Preliminary Publication No. 57-136393, a wire conductor is laid in a desired pattern on an insulating substrate by moving a wiring head along the insulating substrate, wherein the wire conductor heated in advance using ultrasonic vibration is drawn out from the wiring head and embedded in an adhesive layer provided on a surface of the insulating substrate. This technique, however, needs an expensive ultrasonic vibration machine for heating the wire conductor just before it is laid on the substrate. This makes a wiring apparatus complicated in construction and high in cost. Further, controlling the wire temperature is very difficult. If the wire temperature varies, a uniform adhesion of the wire conductor to the adhesive layer cannot be attained, causing an incorrect conductor pattern.

According to the technique disclosed in Japanese Patent Preliminary Publication No. 8-294213, a patterned wire conductor placed on an insulating sheet is heated and pressed by a plate-shaped heating unit, to be embedded in the insulating sheet. This technique helps manufacture the planar coil relatively easily, but needs a heating unit large enough to cover the entirety of the patterned wire conductor. Further, even with such a large heating unit, it is difficult to heat the entirety of the patterned wire conductor uniformly at a time. If the patterned wire conductor is not heated uniformly, the wire conductor cannot be uniformly embedded in the insulating sheet, and, for example, part of the wire conductor rises from the insulating sheet. This may cause deformation and/or breakage of the patterned wire conductor.

Recently, an IC card having an information-processing function has come into widespread use. Particularly, an IC card accommodating therein an antenna coil for wireless communication with an external information processing apparatus is attracting attention. An antenna coil of the IC card of this type is formed on a card substrate and covered with a protective layers. Generally, the antenna coil is formed by etching a copper-foiled card substrate. However, this method requires a complicated process for making an antenna coil, and makes it difficult to form an antenna coil composed of coil parts or coil sections arranged at a sufficiently high density, because adjacent coil parts can be short-circuited if the spacing therebetween is small. The coil parts each have a circular or rectangular shape and arranged as a whole in a spiral form to constitute the antenna coil. Thus, the antenna coil formed by etching is not satisfactory in respect of antenna characteristics and manufacturing cost.

Alternatively, an antenna coil may be formed by plating or printing. With these techniques, however, it is generally difficult to provide an antenna coil with a thick conductor, posing problems in respect of the bending strength and tensile strength of the antenna coil, as well as the strength and reliability of the antenna coil mounted to an IC card.

As for the production of an antenna coil, it is known to soften a card substrate by hot air and embed a wire conductor into a surface portion of the softened card substrate, or to heat a wire conductor in advance with frictional heat generated by ultrasonic vibration and embed the heated wire conductor into a surface portion of a card substrate. However, these methods require severe control of hot air temperature and conductor heating temperature, respectively. When ultrasonic vibration is used, an expensive ultrasonic vibrator is required, which causes an increased equipment cost and fatigue breakage of a wire conductor attributable to ultrasonic vibration.

SUMMARY OF THE INVENTION

An object of the present invention is to provide a wiring method and a wiring apparatus capable of laying a wire conductor easily and precisely in the process of manufacturing a planar transformer, a circuit board, or the like.

Another object of the present invention is to provide an IC card manufacturing method capable of manufacturing an IC card provided with a chip module or an antenna coil, with ease and high reliability and at low cost, using the wiring method and wiring apparatus mentioned above.

In order to attain the above object, according to one aspect of the present invention, there is provided a wiring method comprising the steps of (a) forming an adhesive layer on a surface of a substrate, and (b) sticking a wire conductor on the surface of the substrate by causing a three-dimensional relative movement between the substrate and a wiring head adapted to guide the wire conductor such that the wiring head relatively moves along the adhesive layer formed on the surface of the substrate and the wiring head and the adhesive layer intermittently come close to each other for point contact.

In the wiring method of this invention, during the three-dimensional relative movement between the wiring head and the substrate, the wiring head intermittently comes close to the adhesive layer formed on the surface of the substrate for point contact therewith, so that the wire conductor supplied to and guided by the wiring head may be pressed between the wiring head and the adhesive layer formed on the substrate surface, to be stuck at a point on the substrate surface. Thus, the wire conductor is stuck on the substrate surface, point by point (point to point), securely and uniformly, like a thread fastened stitch by stitch by a sewing machine. The wire conductor is easily laid with high sticking strength and with uniformity only by relatively moving the wiring head and the substrate in three dimensions, so that the possibility of the wire conductor being deformed or broken after it is laid on the substrate may be reduced. As the adhesive layer, an adhesive layer having adhesiveness in an ordinary temperature or a pressure sensitive adhesive layer exhibiting adhesiveness when a pressure is applied by the wiring head is desirable. In the present invention, the wire conductor does not need to be heated before it is laid, making it possible to avoid increased cost due to the provision of heating means, severe control of heating temperature for the wire conductor, and unevenness in sticking the wire conductor on the substrate caused by unsuitable control of heating temperature. Further, the wiring method of this invention has little restriction about the kind of wire conductor and the pattern of relative movement between the wiring head and the substrate, which pattern closely relates to the wiring pattern. Therefore, a desired wire conductor can be laid in a desired wiring pattern, thereby making it possible to manufacture a planar transformer of desired properties, for instance.

Desirably, the three-dimensional relative movement between the wiring head and the substrate executed in the step (b) includes a relative translational motion between the wiring head and the substrate which is performed along the adhesive layer, and a relative reciprocal motion between the wiring head and the substrate which is performed in a direction of thickness of the substrate.

With this desirable method, the three-dimensional relative movement is carried out as a combination of the relative translational motion (two-dimensional relative motion) and the relative reciprocal motion which can be executed independently of each other. Therefore, the three-dimensional relative movement can be made with use of a relatively simple wiring apparatus and under a relatively simple control process. The relative translational motion can be made without interruption. For the relative translational motion, the movement of the wiring head and/or the substrate is controlled, for example, by a route control technique or a point-to-point control technique.

Desirably, the relative translational motion between the wiring head and the substrate is executed in association with the relative reciprocal motion therebetween.

The wire conductor to be laid on the surface of the substrate is comprised of a series of wire conductor sections which are continuous with one another. Each wire conductor section can be defined, for example, as corresponding to that part of the wire conductor which is drawn out from the wiring head in one cycle of the relative reciprocal motion. The relative reciprocal motion consists of a receding motion from a close position in which the wiring head and the adhesive layer are close to each other for point contact to a distant position in which the wiring head and the adhesive layer are most distant from each other, and an approaching motion from the distant position to the close position. The relative reciprocal motion is executed for each wire conductor section. The relative translational motion can be defined as being comprised of a series of relative translational motions performed for the series of wire conductor sections. The relative translational motion for each wire conductor section is carried out in association with the relative reciprocal motion. For example, it is preferable that the relative translational motion for each wire conductor section starts when the receding motion starts, and ends when the approaching motion ends.

In this desirable method, when the receding motion between the wiring head and the substrate is started, the relative translational motion between the wiring head and the substrate is started. During the period from the start of the receding motion to the end of the approaching motion, a given one of the wire conductor sections is drawn out from the wiring head, and the relative translational motion between the wiring head and the substrate is terminated. With this relative translational motion, the wire conductor section is laid on the adhesive layer formed on the substrate surface. At the terminal end of the wire conductor section, the wire conductor is pressed between the wiring head and the adhesive layer formed on the surface of the substrate due to the approaching motion, to be stuck on the surface of the substrate. For the series of wire conductor sections, these conductor sections are disposed and stuck in sequence on the substrate surface. The wire conductor is stuck thereon point by point at respective borders between adjacent pairs of wire conductor sections. The series of relative translational motions is executed by controlling the two-dimensional movement, e.g., of the wiring head or the substrate by a point-to-point control technique. The wiring head and/or the substrate move continuously in appearance, with a short intermission at the border between adjacent wire conductor sections.

Desirably, while a head body of the wiring head and the substrate are disposed to be spaced from each other, a pressing member movably attached to the head body and the adhesive layer formed on the surface of the substrate are caused to contactably close to each other. In this case, the pressing member prevents the wire conductor section already stuck on the surface of the substrate from peeling therefrom.

In the present invention, desirably, the wire conductor supplied to the wiring head is drawn out from the wiring head by the three-dimensional relative movement between the wiring head and the substrate executed in the step (b).

With this desirable method, since the wire conductor is drawn out by the three-dimensional relative movement between the wiring head and the substrate in the step (b), a step of forcedly feeding the wire conductor from the wiring head by using feeding means is not needed.

Desirably, the wiring method of this invention further comprises the steps of (c) providing a second adhesive layer on the wire conductor stuck on the surface of the substrate, and (d) sticking a second wire conductor on the second adhesive layer by causing a three-dimensional relative movement between the substrate and the wiring head adapted to guide the second wire conductor, such that the wiring head relatively moves along the second adhesive layer and the wiring head and the second adhesive layer intermittently come close to each other for point contact.

With this desirable method, wire conductors of the same kind or different kinds can be laid in layers on the substrate.

More desirably, the three-dimensional relative movement between the wiring head and the substrate executed in the step (b) includes a relative translational motion between the wiring head and the substrate which is performed along the adhesive layer, and a relative reciprocal motion between the wiring head and the substrate which is performed in a direction of thickness of the substrate. The relative translational motion is executed in accordance with a first two-dimensional pattern, so that a first wire-conductor pattern corresponding to the first two-dimensional pattern is formed on the surface of the substrate. Further, in the step (c), the second adhesive layer is formed on the first wire-conductor pattern. In the step (d), a relative translational motion between the substrate and the wiring head adapted to guide the second wire conductor is executed in accordance with a second two-dimensional pattern, so that a second wire-conductor pattern corresponding to the second two-dimensional pattern is formed on the second adhesive layer.

With this desirable method, wire conductors of the same kind or different kinds can be laid in layers in the same pattern or different patterns on the substrate.

Desirably, in the step (c), an adhesive sheet, for example, a double-sided adhesive sheet, is stuck on the first wire-conductor pattern to form the second adhesive layer.

This desirable method is convenient in sticking the second adhesive layer at its one side on the adhesive layer provided on the surface of the substrate, with the first wire-conductor pattern interposed therebetween, and in forming the second wire-conductor pattern on the other side of the second adhesive layer.

Desirably, conductors with an insulating coating such as enameled wires (wires with an enamel coating) are used as the wire conductor and the second wire conductor.

With this desirable method, the wire conductor and the second wire conductor or the first wire-conductor pattern and the second wire-conductor pattern can be arranged to extend across each other, without an electrical insulator interposed therebetween. Further, the wire conductors or the wire-conductor patterns can be electrically connected to an external element easily by drawing their ends to the outside, without the need of forming through-holes in the substrate. Further, when the wire conductor or the second wire conductor is to be formed in the shape of a coil, the wire conductor or the second wire conductor can be laid in dense, if necessary, by densely arranging coil sections of the wire conductor one another. Thus, this desirable method is useful, for example, in forming an antenna coil having excellent antenna characteristics.

According to another aspect of the present invention, there is provided a wiring apparatus comprising a supporting mechanism for supporting a substrate having a surface thereof provided with an adhesive layer; a wiring head for guiding a wire conductor, the wiring head being arranged for reciprocal motion between a close position in which the wiring head can be in point contact with the adhesive layer formed on the surface of the substrate and a distant position in which the wiring head is most distant from the adhesive layer; a moving mechanism for causing a relative translational motion between the wiring head and the substrate such that the wiring head relatively moves along the surface of the substrate; and control means for controlling an operation of the moving mechanism.

With the wiring apparatus of the present invention, the wiring head is reciprocated between the close position and the distant position and is caused by the moving mechanism operated under the control of the control means to make a relative translational motion in relation to the substrate so as to relatively move along the surface of the substrate, whereby the wiring head comes close to the adhesive layer formed on the substrate surface each time it assumes the close position. Thus, with use of a relatively simple apparatus arrangement such as to cause the relative translational motion between the substrate and the wiring head that is movable in the directions toward and away from the substrate surface, the wiring head can be intermittently brought close to the adhesive layer for point contact therewith to press the wire conductor between itself and the adhesive layer, whereby the wire conductor can be stuck on the surface of the substrate securely. Further, the wiring apparatus of the present invention has little restriction about the kind of wire conductor, making it possible to lay a desired wire conductor on the substrate.

Desirably, the control means controls the operation of the moving mechanism in accordance with a wiring pattern for laying the wire conductor on the substrate.

With this desirable apparatus, the wiring head is caused by the moving mechanism, operable under the control of the control means, to make the relative translational motion in relation to the substrate in accordance with the wiring pattern, so that the wire conductor guided by the wiring head is laid in the wiring pattern.

In the wiring apparatus of the present invention, desirably, the wiring head has a nozzle for guiding the wire conductor, and when the wiring head is in the close position, a tip of the nozzle is positioned close to the adhesive layer formed on the surface of the substrate for point contact therewith.

With this desirable apparatus, while the wire conductor is being laid, the tip of the nozzle intermittently comes close to the adhesive layer formed on the surface of the substrate for point contact therewith, whereby the wire conductor drawn out from the tip of the nozzle of the wiring head is pressed between the wiring head and the adhesive layer, to be stuck on the surface of the substrate securely.

Desirably, the wiring head has a nozzle having a nozzle hole for guiding the wire conductor, and the nozzle hole extends parallel to the direction of reciprocation of the wiring head.

In this desirable apparatus, while the wiring head recedes from the close position to the distant position, the wire conductor passing through the nozzle hole is drawn out from the wiring head. The relative translational motion between the wiring head and the substrate is associated with the reciprocal motion of the wiring head, for example, as follows: After the wiring head reaches the distant position to cause the wire conductor to be drawn out from the wiring head, the relative translational motion is made between the wiring head and the substrate, so that the wire conductor is disposed on the surface of the substrate. Then, the wiring head and the adhesive layer formed on the surface of the substrate are moved to close to each other, whereby the wire conductor is pressed between the wiring head and the adhesive layer, to be stuck to the surface of the substrate. With this desirable apparatus, the wire conductor can be drawn out from the wiring head and laid securely, without using a device for forcedly feeding the wire conductor from the wiring head.

Desirably, the moving mechanism includes a first table arranged for reciprocal motion relative to the supporting mechanism, and a second table for supporting the wiring head, the second table being arranged for reciprocal motion in a direction perpendicular to an axis along which the first table is reciprocated.

With this desirable aspect, the moving mechanism for causing the relative translational motion of the wiring head in relation to the surface of the substrate can have a simple structure.

Desirably, the wiring head includes a supporting portion mounted to the moving mechanism, a shaft portion supported for reciprocal motion by the supporting portion, a nozzle for guiding the wire conductor, the nozzle being attached to the shaft portion on a side thereof facing the surface of the substrate, an eccentric cam rotatably supported by the supporting portion, and a cam follower attached to the shaft portion on a side thereof remote from the surface of the substrate and disposed in contact with a cam face of the eccentric cam.

With this desirable apparatus, the shaft portion and the nozzle of the wiring head can be reciprocated relative to the substrate surface by rotating the eccentric cam.

More desirably, a plurality of nozzles are detachably attached to the shaft portion of the wiring head. In this case, from among the plurality of nozzles attached to the wiring head, a nozzle suitable for the kind of a wire conductor to be laid on the substrate can be selected for use. Further, the nozzles can be replaced if necessary.

Alternatively, the wiring head includes a head body mounted to the moving mechanism, a nozzle for guiding the wire conductor, the nozzle being supported by the head body for reciprocal motion and for point contact with the adhesive layer formed on the surface of the substrate, a pressing member supported by the head body for reciprocal motion and for point contact with the adhesive layer, a first and second permanent magnets attached to the nozzle and the pressing member, respectively, and having different directions of magnetism, and an electromagnet attached to the head body for electromagnetic interaction with the first and second permanent magnets.

In this desirable apparatus, when an alternating current is supplied to the electromagnet, the nozzle and the pressing member of the wiring head are caused to move in the opposite directions toward and away from the substrate surface due to the electromagnetic interaction between the electromagnet and the first and second permanent magnets. While the wire conductor is being laid, the nozzle and the adhesive layer formed on the substrate surface intermittently come close to each other for point contact to press the wire conductor therebetween, whereby the wire conductor is stuck on the surface of the substrate securely. Further, as the nozzle and the adhesive layer are moved away from each other, the pressing member and the adhesive layer are moved close to each other, thereby pressing the wire conductor disposed on the adhesive layer therebetween, so as to prevent the wire conductor having been stuck on the substrate surface from separating therefrom. Desirably, the nozzle is detachably attached to the head body and can be replaced with another nozzle, depending on the kind of a wire conductor to be laid.

According to another aspect of the present invention, there is provided an IC card manufacturing method comprising the steps of (a) sticking an electrical component on an adhesive sheet; (b) laying a wire conductor on the adhesive sheet by causing a relative movement between the adhesive sheet and a wiring head adapted to guide the wire conductor such that the wiring head relatively moves along a surface of the adhesive sheet and the wiring head and the adhesive sheet intermittently come close to each other for point contact; (c) electrically connecting each end of the wire conductor to the electrical component; and (d) sticking the adhesive sheet and a card substrate together.

In the IC card manufacturing method of the present invention, when the wire conductor is to be laid on the card substrate, neither the card substrate nor the wire conductor needs to be heated. Thus, increase of cost due to the use of heating means, severe control of heating temperature, and fatigue breakage of the wire conductor due to heating by ultrasonic vibration can be avoided, therefore, IC cards can be manufactured easily, with high reliability and at low cost.

In the IC card manufacturing method of the present invention, desirably, in the step (d), a first card substrate is stuck on that first surface of the adhesive sheet on which the electrical component is stuck, and a second card substrate is stuck on a second surface of the adhesive sheet.

With this desirable method, a protection can be provided for the electrical component stuck on and the wire conductor laid on the adhesive sheet by sandwiching the electrical component and the wire conductor between the first and second card substrates.

More desirably, in the step (a), the electrical component is stuck on an exposed first adhesive surface of a double-sided adhesive insulating sheet having a second adhesive surface thereof provided with a separating sheet. In the step (b), the wire conductor is laid on the exposed first adhesive surface of the double-sided adhesive sheet. In the step (d), the first card substrate is stuck on the exposed first adhesive surface of the double-sided adhesive sheet, the separating sheet is separated from the second adhesive surface of the double-sided adhesive sheet, and then the second card substrate is stuck on the second adhesive surface.

With this desirable method, the first and second card substrates can be stuck on the double-sided adhesive sheet, making use of the adhesiveness thereof. Thus, the sticking step (b) can be carried out easily.

In the IC card manufacturing method of the present invention, desirably, in the step (b), an antenna coil is formed on the adhesive sheet by laying the wire conductor in a predetermined pattern on the adhesive sheet.

In this desirable method, the antenna coil is formed of the wire conductor laid on the adhesive sheet, through a relative movement between the wiring head and the adhesive sheet. The laying step has little restriction about the kind of wire conductor to be laid and the relative movement between the wiring head and the adhesive sheet for the laying step can be controlled precisely. Thus, for example, by using an copper wire with an enamel coating as the wire conductor, coil sections of the wire conductor, each of which has a circular or rectangular shape and which are disposed as a whole into a spiral form, are arranged at a high density while ensuring the insulation between adjacent coil sections, whereby the antenna characteristics of an antenna coil can be improved, and therefore, an IC card accommodating therein an antenna coil of desired antenna characteristics and adapted for wireless communication can be provided.

Desirably, in the step (a), at least one of a semiconductor chip, a chip resistor, a chip capacitor and a terminal is stuck on the adhesive sheet as the electrical component.

With this desirable method, by sticking desired electrical components on the adhesive sheet, an IC card having desired capability can be manufactured.

Desirably, in the step (a), a plurality of electrical components are stuck on the adhesive sheet; in the step (b), at least one electric wiring pattern is formed on the adhesive sheet by laying the wire conductor in a predetermined pattern on the adhesive sheet; and in the step (c), the electric wiring pattern is electrically connected with relevant ones of the plurality of electrical components.

With this desirable aspect, the electrical components can be connected via the electric wiring pattern formed of the wire conductor. Thus, the IC card can be manufactured easily.

DETAILED DESCRIPTION OF THE INVENTION

With reference to the drawings, a wiring apparatus according to a first embodiment of the present invention will be described below.

Figure 1:
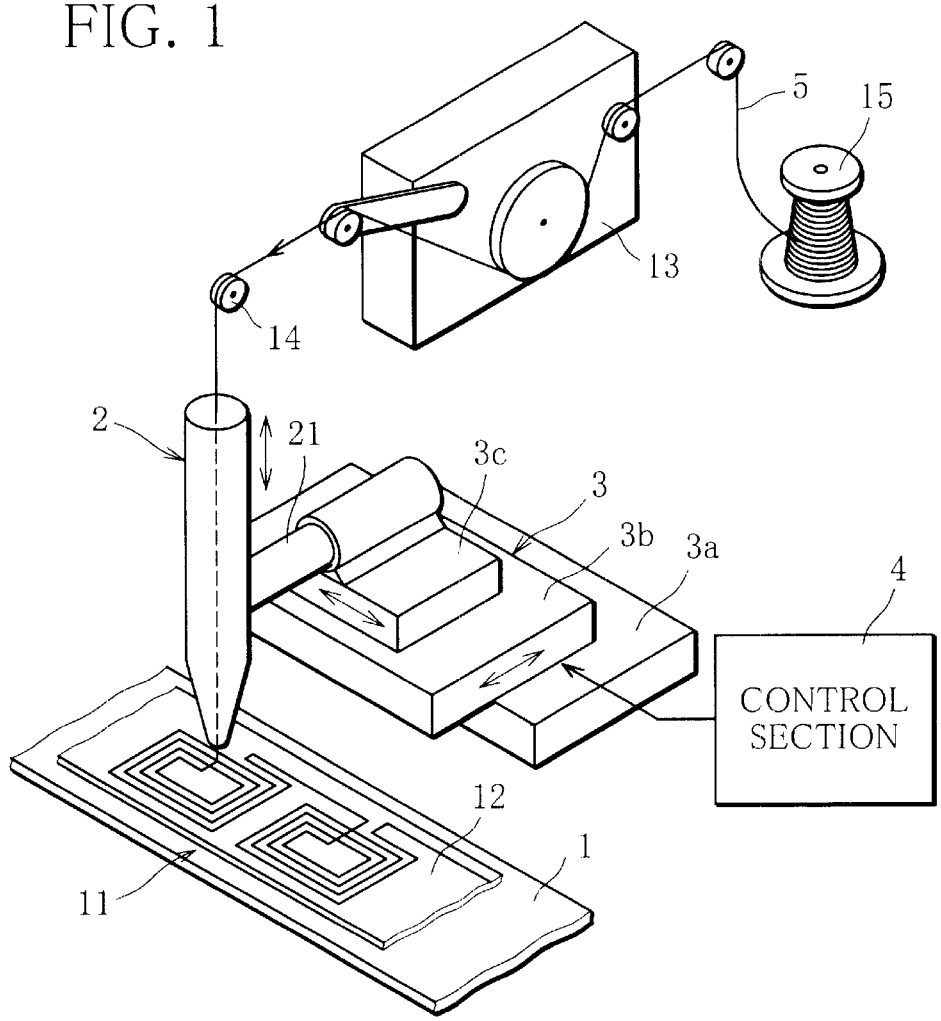
FIG. 1 is a schematic perspective view of a wiring apparatus according to a first embodiment of the present invention.

In FIG. 1, the wiring apparatus of the present embodiment is adapted to lay a wire conductor 5 on the surface of a substrate 11. The following description will mainly explain the case where the wire conductor 5 is laid in the shape of a coil to form a planar coil.

The substrate 11 is a flexible film comprising a base of polyester, polyimide or the like and shaped into the form of a tape or a sheet (so-called adhesive tape). On the surface of the substrate 11, an adhesive layer 12 such as a thermosetting rubber adhesive layer, an acrylic adhesive layer, a silicone adhesive layer or the like is formed. The substrate 11 may be an insulating substrate with an adhesive layer 12 formed on the surface thereof. It is desirable that the adhesive layer 12 has a certain adhesive strength in an room temperature. As the wire conductor 5, a suitable one satisfying the requirements of a planar coil, wiring pattern or the like is chosen from among a bare copper wire, an enameled wire having an insulating coating of synthetic resin on a copper wire (enameled copper wire having a round or rectangular shape in cross section), a litz wire consisting of a plurality of enameled wires twisted together, and the like.

As shown in FIG. 1, a wiring apparatus includes a table 1 functioning as a supporting mechanism for supporting the substrate 11, a wiring head 2 for guiding the wire conductor 5 which is continuously fed from a feed reel 15 through a feed unit including a tensioner 13, feed rollers 14 and the like, a moving mechanism 3 for supporting and moving the wiring head 2 along the surface of the substrate 11, and a control section 4 for controlling the operation of the moving mechanism 3.

Specifically, the moving mechanism 3 includes a base 3a located laterally of the table 1, a first table 3b arranged on the base 3a for reciprocal motion in the longitudinal direction of the substrate 11 (in X-axis direction), and a second table 3c arranged on the first table 3b for reciprocal motion in the width direction of the substrate 11 (in Y-axis direction). On the second table 3c, a supporting arm 21 of the wiring head 2 is fixed. The first and second tables 3b, 3c are each driven by a table driving section including an actuator such as a motor. Since the table driving section 3 is conventionally known, the illustration and explanation thereof will be omitted. The moving mechanism 3 is arranged to move the wiring head 2 along the surface of the substrate 11 two-dimensionally (in a plane) under the control of the control section 4 including a micro processor.

In place of the table 1, a conveyor for conveying the substrate 11 at a fixed speed may be used as the supporting mechanism. Further, in place of the feed unit having a function of feeding the wire conductor, a guide unit for simply guiding the wire conductor may be located between the reel 15 and the wiring head 2.

The wiring head 2 is driven by the moving mechanism 3 to move in an XY plane, and is arranged for reciprocal motion in the thickness direction of the substrate 11 or for up-and-down motion, so that the tip of a nozzle of the wiring head is caused to intermittently come close to the substrate surface for point contact therewith, whereby the wire conductor 5 fed from the tip of the nozzle is laid on the surface of the substrate 11. As described later, under the control of the control section 4, the up-and-down motion of the wiring head 2 is performed in association with the two-dimensional movement of the wiring head caused by the moving mechanism 3.

Figure 3:
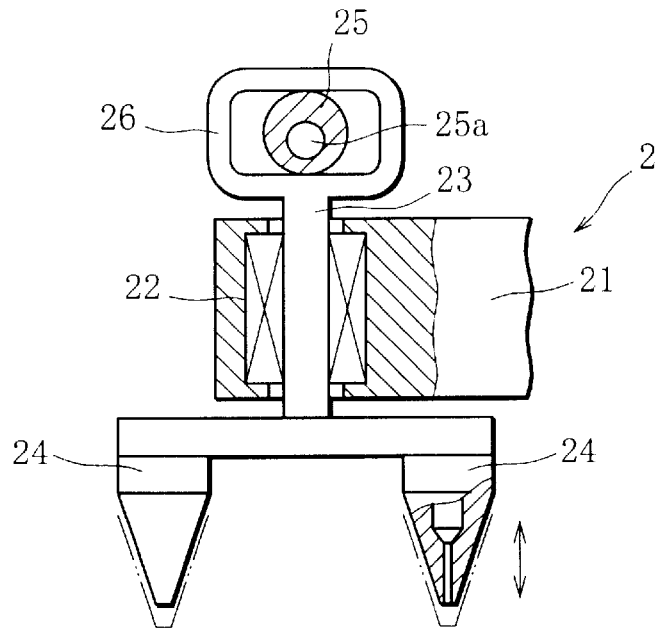
FIG. 3 is a schematic view showing partly in cross section a wiring head shown in FIG. 1.

As shown in FIGS. 1 and 3, the wiring head 2 includes a supporting arm 21 fixed to the moving mechanism 3, and a shaft portion 23 supported by the supporting arm 21 through thrust bearings 22 for up-and-down motion. Two nozzles 24 for guiding the wire conductor 5 are detachably attached at the opposite ends of a lower bracket portion of the shaft portion 23. The two nozzles 24 have nozzle holes suited to guide wire conductors 5 of different wire diameters. Thus, one of the two nozzles 24 can be selectively used, for example, depending on the kind of wire conductor 5. If necessary, the nozzles 24 can be replaced with other appropriate nozzles.

A cam follower 26 in the shape of a rectangular ring is provided at the upper end of the shaft portion 23, and an eccentric cam 25 is arranged inside the cam follower 26 so that the cam face may be in contact with the inner face of the cam follower. The shaft portion 25a of the eccentric cam 25 is rotatably supported, for example, by the supporting arm 21, and coupled to a motor (not shown). As the motor rotates, the eccentric cam 25 rotates, so that the cam follower 26, the shaft portion 23, and the nozzle 24 move up and down together, and the tip of the nozzle 24 comes into contact with the surface of the adhesive layer 12, intermittently. The stroke of the up-and-down motion of the nozzle 24 (wiring head 2) is arranged, for example, to be about 1–2 mm when a conductor 5 of 0.3 mm in diameter is to be laid. The frequency or cycle of the up-and-down motion of the nozzle 24 (wiring head 2) may be arranged in view of the speed of laying the wire conductor. It is arranged, for example, to be about 50 Hz.

Figure 4:
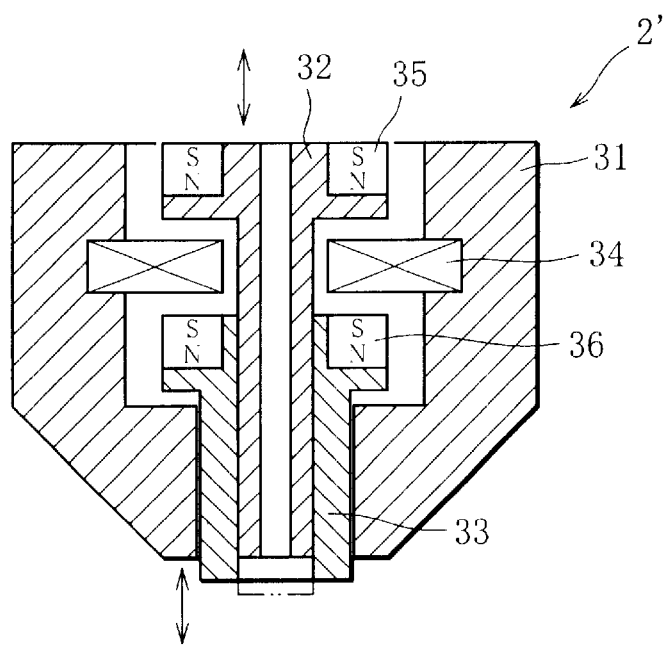
FIG. 4 is a schematic cross-sectional view of another wiring head.

FIG. 4 shows another example of wiring head structure. The wiring head 2' shown in FIG. 4 has a head body 31, which is fixed to the second table 3c of the moving mechanism 3. Inside the head body 31, a cylindrical nozzle 32, a cylindrical pressing member 33 for preventing the wire conductor 5 that has been laid on the surface of the substrate from rising, and an electromagnet 34 are arranged. The nozzle 32 extends over the entire height of the head body 31, and is supported by head body 31 through the pressing member 33 so as to be movable up and down. Around an upper end portion of the nozzle 32, a ring-shaped permanent magnet 35, 36 is fitted. The pressing member 33 extends up to the bottom of the head body 31 underneath the electromagnet 3, and is supported by the head body 31 for up-and-down motion. Around an upper end portion of the pressing member 33, a ring-shaped permanent magnet 36 is fitted having a different direction of magnetism from that of the permanent magnet 35, 36.

The wiring head 2' is arranged to cause the nozzle 32 and the pressing member 33 to reciprocate vertically by means of the electromagnet 34 attracting and repelling the permanent magnets 35, 36. Specifically, when the electric current is supplied to the electromagnet 34 to magnetize the electromagnet 34 such that a north pole is at the lower face of the electromagnet, the nozzle 32 and the pressing member 33 are attracted by the electromagnet 34. As a result, the pressing member 33 is drawn up into the head body 31, while the nozzle 32 projects from the lower faces of the head body 31 and the pressing member 31 as indicated by a two-dot-line in FIG. 4. At that time, the nozzle 32 comes close to the adhesive layer 12 on the surface of the substrate 11 to the extent that the nozzle 32 can come into contact therewith, and the wire conductor 5, which is fed from the tip of the nozzle 32, is pressed onto the adhesive layer 12 by the nozzle 32 and stuck on the surface of the substrate. On the other hand, when the electric current is supplied to the electromagnet 34 in the opposite direction to magnetize the electromagnet 34 such that a north pole is at the upper face of the electromagnet, the electromagnet 34 and the permanent magnets 35, 36 repel each other. As a result, the nozzle 32 is drawn up into the head body 31 as indicated by a solid line in FIG. 4, while the pressing member 33 projects from the lower faces of the head body 31 and the nozzle 32. At that time, the pressing member 33 presses, with its tip end, the wire conductor 5 that has been laid on the substrate 11 and prevents the wire conductor 5 from rising from the surface of the substrate.

With the wiring head 2' shown in FIG. 4, the nozzle 32 can be moved up and down at a speed higher than that of the wiring head 2 shown in FIG. 3 and causing the nozzle 24 to move up and down mechanically by means of the eccentric cam 25. Therefore, the speed of laying a wire conductor can be increased. Further, the wiring head 2' can lay the wire conductor 5, preventing the wire conductor 5 from rising by means of the pressing member 33. Therefore, the wire conductor 5 can be stuck on the surface of the substrate securely and reliably.

The wiring apparatus is arranged to cause the wiring head 2 or 2' to move up and down and to make a translational motion along the surface of the substrate in accordance with a predetermined two-dimensional motion pattern by means of the moving mechanism 3 operated under the control of the control section 4. When the wiring head 2 or 2' moves up and down, the wiring head reciprocates between a close position in which the tip of the nozzle is close to the adhesive layer 12 provided on the surface of the substrate to the extent that it can be in point contact with the adhesive layer 12, and a distant position in which the tip of the nozzle is most distant from the surface of the substrate.

Next, the operation of the wiring apparatus with the wiring head 2 will be described.

In the process of laying the wire conductor 5 on the surface of the substrate 11, when the wiring head 2 moves down to the close position where the tip of the nozzle can be in point contact with the adhesive layer 12 formed on the substrate surface, the wire conductor 5 fed from the tip of the nozzle is strongly stuck, via the adhesive layer 12, to the surface of the substrate 11 locally or in spot at its point-contact portion. Then, the wiring head 2 starts moving up, and the wire conductor 5 is drawn out (fed) from the tip of the nozzle by the length corresponding to the distance for which the wiring head 2 moves up. In the period from the time the wiring head 2 starts moving up to the time the wiring head 2 moves down to the close position again, one or both of the first and second tables 3b, 3c of the moving mechanism 3 move in a direction determined by the wiring pattern for a distance determined by the wiring pattern, so that the wiring head 2 moves along the substrate surface linearly or two-dimensionally. After the wiring head 2 moves that way, the tip of the nozzle of the wiring head 2 again comes into point contact with the adhesive layer 12, with the wire conductor 5 interposed therebetween, and the conductor 5 is strongly stuck to the substrate surface locally on that point-contact spot. As mentioned above, that portion of the wire conductor 5 (one wire conductor section) which has been drawn out from the wiring head 2 by the upward movement of the wiring head 2 is disposed on the adhesive layer 12 on the substrate surface by the linear or two-dimensional movement and the downward movement of the wiring head 2, so as to extend from the point-contact spot for the preceding cycle to the spot for the present cycle. On each point-contact spot, the wire conductor 5 is strongly stuck. As a result, the wire conductor 5 is stuck on the substrate surface via the adhesive layer 12 by the length corresponding to one wire conductor section.

Figure 2:
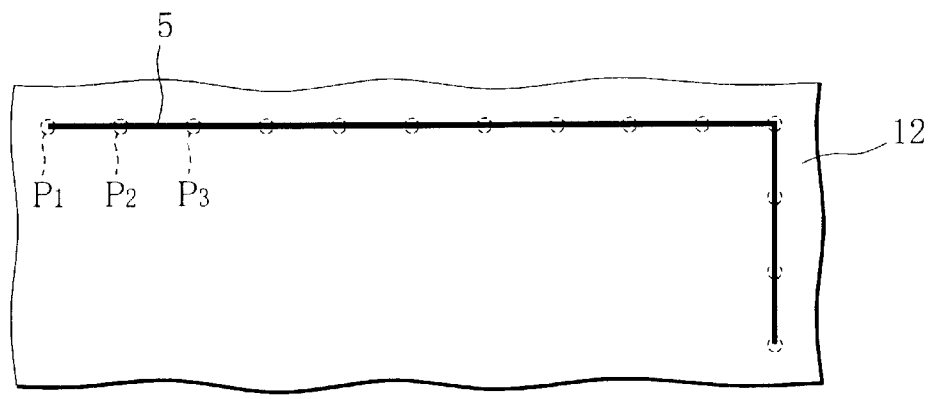
FIG. 2 is a schematic plan view showing how a wire conductor is laid with use of the wiring apparatus shown in FIG. 1.

For a series of wire conductor sections, the operation of laying and locally and strongly sticking the wire conductor 5 on the substrate surface is carried out in sequence by means of the up-and-down movement of the wiring head 2 and the horizontal movement of the wiring head 2 caused by the moving mechanism 3 in accordance with a wiring pattern. As a result, the wire conductor 5 is stuck on the substrate surface in a predetermined wiring pattern, like a thread is fastened stitch by stitch by a sewing machine. In FIG. 2, reference signs P1, P2, P3 and dashed-line circles denote point-contact spots where the tip of the nozzle of the wiring head 2 and the adhesive layer 12 are in point contact with each other via the wire conductor 5 (i.e., local positions at which the wire conductor 5 is strongly stuck on the substrate surface via the adhesive layer 12).

With the above-described wiring apparatus, each time the tip of the nozzle of the wiring head 2 comes into point-contact with the substrate surface intermittently, the wire conductor 5 is strongly stuck on the substrate surface at its point-contact portion, so that the wire conductor 5 is extended securely between adjacent wire-conductor sticking points. While the movement of the wiring head 2 is controlled in accordance with a predetermined wiring pattern, the wire conductor 5 drawn out from the tip of the nozzle of the wiring head 2 by means of the up-and-down motion of the wiring head 2 is strongly stuck on the substrate surface point by point, whereby the wire conductor is laid on the surface of the substrate in wiring pattern. As a result, a planar coil with a desired coil pattern can be formed easily with high precision.

In particular, according to the wiring apparatus continuously laying the wire conductor 5 simply by sticking the conductor 5 locally at predetermined intervals on the adhesive layer 12 provided on the substrate surface and exhibiting adhesiveness, for example, in an ordinary temperature, the wire conductor 5 is not required to be heated in advance, unlike the conventional apparatus, so that the apparatus arrangement can be much simplified in construction. In addition, since the horizontal movement of the wiring head 2 is started after the wiring head 3 moves up to be apart from the substrate surface, the horizontal movement is never hindered by the adhesiveness of the adhesive layer 12. Specifically, according to the conventional apparatus in which a wire conductor heated in advance is laid on a substrate, the laying of the wire conductor is continuously made by horizontally moving the wiring head while keeping the tip of the nozzle of the wiring head to be in contact with the substrate surface, like a picture being drawn with one stroke. In this case, if the adhesive layer shows adhesiveness in an ordinary temperature, the horizontal movement of the tip of the nozzle is hindered by the adhesiveness. By contrast, the wiring head 2 of the present apparatus, which is adapted for intermittent point contact with the substrate while making the vertical reciprocal movement, is enabled to make a smooth horizontal movement, whereby the wiring pattern can be formed with high precision.

As for the combinations of the substrate 11 and the wire conductor 5 shown in table 1, the present inventors carried out experiments in which the wiring head 2 was caused to move horizontally in accordance with a wiring pattern while making an up-and-down motion at a frequency of 50 Hz. With each combination, a satisfactory planar coil was obtained. That is, it was ascertained that the wire conductor was able to be laid satisfactorily without any problem, even when the horizontal movement of the wiring head 2 was made synchronuously with the up-and-down motion, if the up-and-down motion of the wiring head 2 was made at a frequency on the aforementioned order at which it takes only a very short time for the wire conductor 5 to be strongly and locally stuck on the substrate 11 by the wiring head

TABLE 1

| Example | Substrate 11 | Conductor 5 |
|---------|--------------|-------------|
| 1 | Adhesive tape with an adhesive layer of thermosetting rubber (Polyester tape #UL58 manufactured by Sumitomo 3M) | Grade 2 (J is C3202) polyurethane enameled wire (wire diameter: 0.07 mm) |
| 2 | Adhesive tape with an adhesive layer of silicone (Polyester tape #336 manufactured by Nittoh Denkoh) | Bare copper wire (wire diameter: 0.3 mm) |

TABLE 1-continued

| Example | Substrate 11 | Conductor 5 |
|---------|--------------|-------------|
| 3 | Adhesive tape with an adhesive layer of silicone (Polyester tape #646S manufactured by Teraoka Seisakusho) | Litz wire consisting of 7 Grade 2 (Js C3202) polyurethane enameled wires stranded together, each enameled wire being 0.1 mm in wire diameter |
| 4 | Adhesive tape with an adhesive layer of thermosetting silicone (Polyester tape #UL92 manufactured by Sumitomo 3M) | |

Next, referring to FIGS. 5A to 5F, an example of a planar transformer manufactured with the above-described wiring apparatus will be described.

Figure 5A:
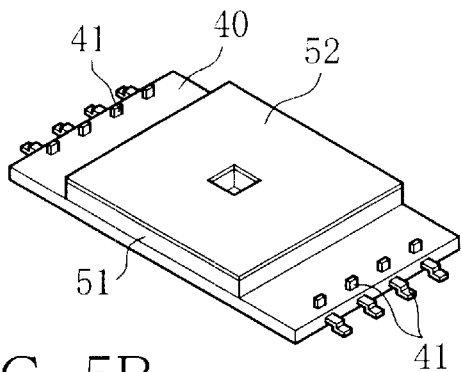
FIG. 5A is a schematic perspective view showing a step of forming an adhesive layer on a first core as a substrate in the process of manufacturing a planar transformer.

In the process of manufacturing the planar transformer, as shown in FIG. 5A, a first ferrite core 51 in the shape of a square frame-like flat plate, serving as a substrate 11, is first provided on a glass-epoxy substrate 40, for example. The first ferrite core 51 serves to constitute part of a core of a planar transformer. Next, as an adhesive layer 12 provided on the surface of the substrate, a double-sided adhesive tape 52 such as one manufactured by Teraoka Seisakusho [#7021 or #769] is stuck on the upper surface of the first ferrite core 51. In FIGS. 5A to 5F, reference numeral 41 denotes a plurality of connecting terminals that are provided at side edge portions of the glass-epoxy substrate 40 in advance.

Figure 5B:
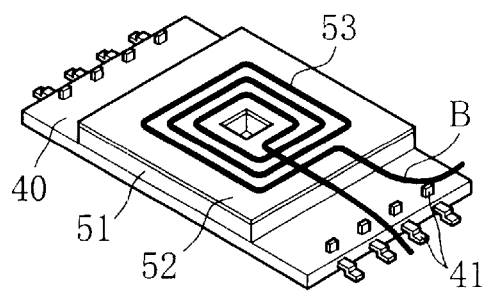
FIG. 5B is a schematic perspective view showing a step of laying a wire conductor on the adhesive layer.

Then, as shown in FIG. 5B, a wire conductor 5, for example, a 0.1 mm UEW that is a copper wire with an insulating coating is laid on the adhesive layer 52 in a predetermined coil pattern, thereby forming a primary coil 53. After the primary coil 53 is laid, the terminal end portion of the conductor 5 is extended across the patterned coil to the outside of the substrate 11. The beginning and terminal ends of the conductor 5 are wound onto connecting terminals 41 with a winding device or by hand, and then soldered to the terminals 41.

Figure 6A:
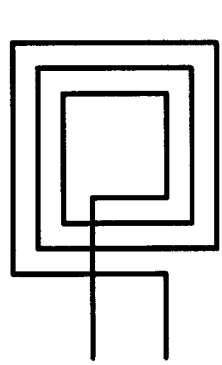
FIG. 6A is a schematic plan view showing an example of a planar coil pattern.
Figure 6B:
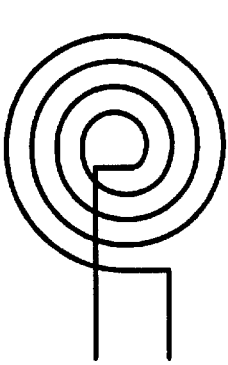
FIG. 6B is a schematic plan view showing another example of a planar coil pattern.
Figure 6C:
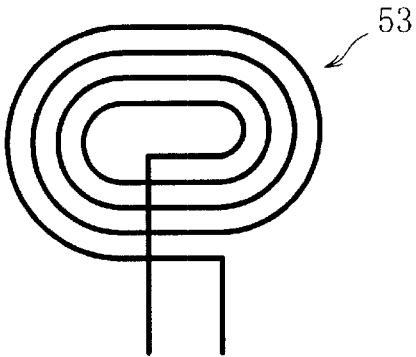
FIG. 6C is a schematic plan view showing another example of a planar coil pattern.
Figure 6D:
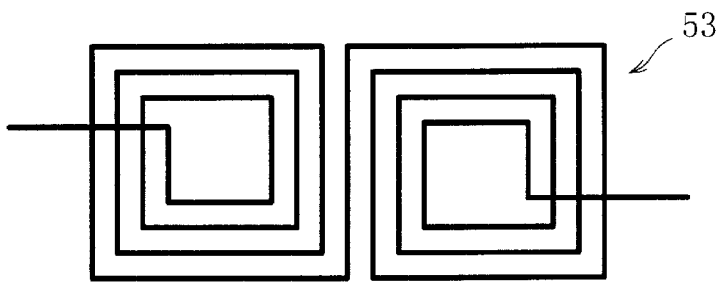
FIG. 6D is a schematic plan view showing another example of a planar coil pattern.

The coil pattern for the coil 53 may be any of rectangular, cirular and elliptic spiral patterns as shown in FIGS. 6A to 6C.

Figure 5C:
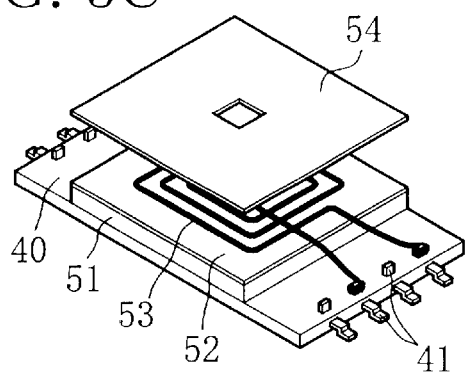
FIG. 5C is a schematic perspective view showing a step of forming a second adhesive layer on the wire conductor.
Figure 5D:
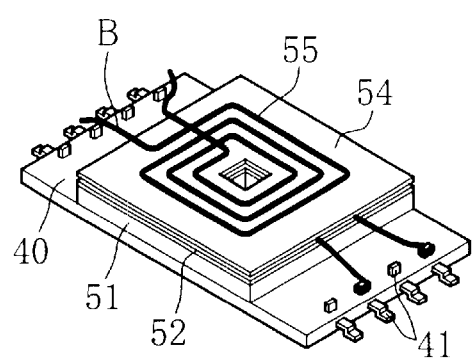
FIG. 5D is a schematic perspective view showing a step of laying a second wire conductor on the second adhesive layer.

After the primary coil 53 is laid on the adhesive layer 52 as described above, a double-sided adhesive tape 54 serving as an adhesive layer (second adhesive layer) such as one manufactured by Teraoka Seisakusho [#7021 or #769] is, as shown in FIG. 5C, stuck on the primary coil 53. Then, as shown in FIG. 5D, a wire conductor 5, for example, a 0.05 mm UEW that is a copper wire with an insulating coating is laid on the adhesive layer 54 in a predetermined coil pattern, to thereby form a secondary coil 55. In forming the secondary coil 55, the horizontal movement of the wiring head 2 is controlled in association with the position of the primary coil 53, so that the secondary coil 55 is arranged in a facing relation with the primary coil 53. Then, the beginning and terminal ends of the conductor 5 of the secondary coil 55 are connected to connecting terminals 41 as in the case of the primary coil 53.

In a case where the secondary coil 55 is formed with use of a conductor 5 having a wire diameter different from that of the conductor 5 for the formation of the primary coil 5, it is desirable to prepare and selectively use two wiring heads 2 or two wiring head nozzles 24 (or 32), which are respectively suited to the conductors 5 having different wire diameters, in laying the coils 53, 55. In the case of a wiring apparatus of the aforementioned type having a plurality of wiring heads 2 or nozzles that can be used selectively, there is no need of setting a conductor to the wiring head 2 or the nozzle 24, 32 each time a conductor 5 to be laid is changed, whereby troublesome work such as inserting a conductor 5 can be eliminated and the efficiency of wiring can be improved.

Figure 5E:
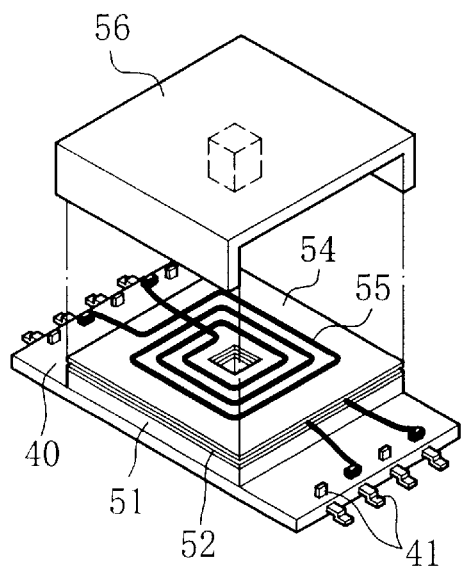
FIG. 5E is a schematic perspective view showing a step of mounting a second core on the first core.
Figure 5F:
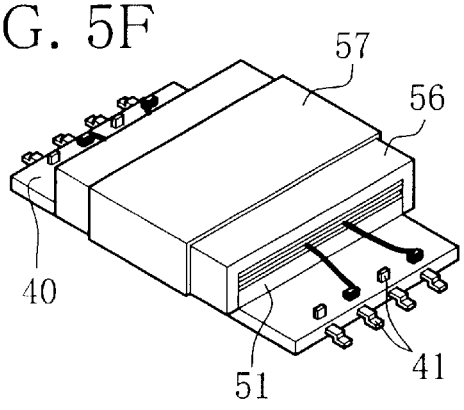
FIG. 5F is a schematic perspective view showing a step of combining the first and second cores together.

As shown in FIG. 5E, a second ferrite core 56 having, for example, an E-shaped cross section is fitted on the secondary coil 55 from above, so that the first and second ferrite cores 51, 56 are magnetically coupled. Then, as shown in FIG. 5F, an adhesive tape 57 for use in fixation, for example, an adhesive tape [#760] manufactured by Teraoka Seisakusho is wound on the circumferential face of the second core 56 and the rear side of the glass epoxy substrate 40, thereby combining the cores 51, 56.

In the planar transformer manufactured as above, the primary and secondary coils 53, 55, which have been laid by the wiring head 2 on the adhesive layers 52, 54 two-dimensionally in the predetermined coil patterns, are arranged opposite to and close to each other, with the adhesive layer 54 interposed therebetween. Further, the primary and secondary coils 53, 55 are arranged close to the first and second ferrite cores 51, 56, respectively, and the cores 51, 56 form a magnetic path surrounding the primary and secondary coils 53, 55. Thus, the planar transformer having the coils 53, 55 securely magnetic-coupled can be formed easily. Since the distance between adjacent coil-parts or coil sections, the number of turns and the like in the patterned coil can be determined as desired, coils of different requirements can be manufactured with ease and high precision. Further, the distance between coil-parts can be made small enough, resulting in an improved coupling efficiency.

Although the primary and secondary coils 53, 55 are provided in two layers in this example, another coil may be laid further. It is also possible to form the secondary coil on the first ferrite core 51 and then form the primary coil thereon, with the adhesive layer 54 interposed therebetween. In other words, the primary and secondary coils may be formed in the reverse order.

In the planar transformer, the beginning and terminal ends of each coil 53, 55, which is made of a copper wire with an insulating coating, are extended across the coil to the outside, to be connected to the connecting terminals 41. Thus, without using an advanced connecting technique requiring the provision of through-holes or the like, an electrical connection between the coils 53, 55 can be securely established, escaping troubles such as a short circuit.

Preferably, a triple insulated winding wire such as wires marketed under the trade names "TEX-E" and "TEXE-LZ" is used as at least one of the wire conductors 5 for the coils 53, 55. The triple insulated winding wire of this kind has a function of reinforced insulation and meets the safety standards such as IEC60950 and IEC60065. By using the triple insulated winding wires to form the coils 53, 55, a transformer with an improved insulation between the coils 53, 55 can be manufactured, even when a substrate on which the coils 53, 55 are stuck is made of a single sheet whose insulating capability is not sufficiently high. This contributes to downsizing the transformer.

Figure 7:
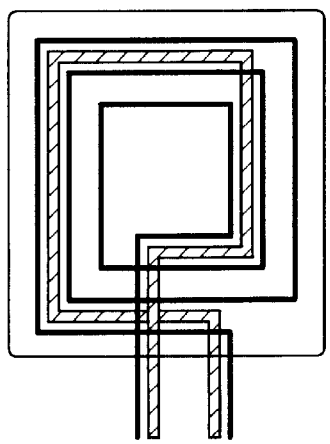
FIG. 7 is an illustration showing an example where two planar coils are formed on the same substrate.

In the case of planar coils comprised of a copper wire with an insulating coating, it is possible to lay a planar coil by utilizing spaces between coil-parts of another planar coil. For example, as shown in FIG. 7, a planar coil formed of an enameled wire can be laid between coil-parts of another planar coil that is formed of a litz wire. When a plurality of planar coils are laid on the same substrate 11 utilizing spaces between coil-parts in this manner, the magnetic coupling between the coils can be improved sufficiently. Thus, a transformer having a desired performance and a reduced height can be easily manufactured.

When enameled wires are employed for the manufacture of a transformer that meets the international standard regarding the safety of information equipment (IEC60950), three or more insulating layers must be provided between the coils 53, 55 so as to improve insulation therebetween. If such an insulating layer is constituted by a single insulator, the thickness of the insulating layer must have 0.4 mm or more. To easily attain improved insulation to meet the international standard, an insulating layer of a three-layer structure may be employed. This insulating layer is comprised of adhesive insulating tapes (adhesive layer 54) and an insulating tape affixed thereto. The former insulating tapes each have an insulating layer and provide a required withstand voltage, whereas the latter insulating tape has one insulating layer. For example, each of the adhesive layers 51, 54 may be comprised of three adhesive insulating tapes which are stacked in three layers one another and each of which is comprised of a polyester tape having a thickness of 25 $\mu$m and a required withstand voltage and having both sides thereof provided with adhesive layers. In this case, the thickness of each adhesive layer 51, 54 can be about 0.1 mm. This can be much help in making a planar coil thinner, meeting the safety standard sufficiently.

Further, a plurality of planar coils each having both sides thereof provided with two-layer adhesive insulating tapes may be stacked one another, to obtain a unit that meets the safety standard easily. For example, a planar coil unit may be obtained by stacking two adhesive insulating tapes on a planar coil that is formed on a substrate 11 of a two-layer structure comprised of two adhesive insulating tapes. The planar coil unit has such a sandwich structure that the planar coil provided at its upper and lower sides with two-layer adhesive insulating tapes. In the case of a transformer comprised of an arbitrary number of the just-mentioned planar coil units of sandwich structure which are stacked one another, four insulating layers are positively provided between adjacent planar coils, whereby an improved insulation to sufficiently meet the safety standard can be provided easily.

In this embodiment, the wiring head 2 moves up and down at a predetermined frequency, while making a horizontal motion along the surface of the substrate. In other words, both the motions of the wiring head 2 are not associated with each other. Alternatively, these motions of the wiring head 2 may be associated with each other.

For example, the horizontal movement and the up-and-down motion of the wiring head 2 can be associated such that the wiring head 2 starts the horizontal movement for each wire conductor section when the wiring head 2 starts moving up, and finishes it when the wiring head 2 finishes moving down. The term "wire conductor section" indicates a wire conductor portion drawn out from the wiring head 2 during one cycle of the up-and-down motion of the wiring head 2. The up-and-down motion of the wiring head 2 can be considered as being performed for each wire conductor section, while the horizontal movement as being comprised of a series of horizontal motions for a series of conductor sections. In case that the horizontal movement of the wiring head 2 for each conductor section is associated with the up-and-down motion as described above, a given one section of the wire conductor 5 is drawn out from the wiring head during a corresponding one cycle of up-and-down motion of the wiring head 2, and the same time the horizontal movement of the wiring head 2 associated with that conductor section is carried out, whereby the one conductor section is disposed on the surface of the substrate and is strongly stuck at its terminal end thereon. The horizontal movement and the up-and-down motion of the wiring head 2 are made for all the wire conductor sections, so that the wire conductor 5 is strongly stuck on the substrate surface point by point. Thus, the entire wire conductor 5 is stuck on the surface of the substrate. The series of horizontal movements is performed by controlling the two-dimensional movement of the wiring head 2 by means of point-to-point control technique, for example. In a control program for the point-to-point control, target positions for the wiring head 2, for each wire conductor section, are programmed in accordance with the wiring pattern.

Next, with reference to FIGS. 8A to 8E, an IC card manufacturing method according to a second embodiment of the present invention will be described.

Figure 8A:
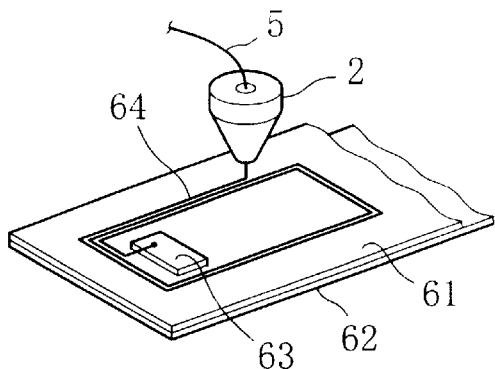
FIG. 8A is a schematic perspective view showing a step of sticking an electrical component and laying a wire conductor on an adhesive sheet in an IC card manufacturing method according to a second embodiment of the present invention.

In the IC card manufacturing method, as shown in FIG. 8A, a double-sided adhesive sheet 61 with a separating sheet 62 on its rear side is prepared, and electrical components are stuck on the exposed adhesive surface of the double-sided adhesive sheet 61 [first step]. The electrical components include, for example, a semiconductor chip (IC chip) 63 such as a semiconductor integrated circuit device, a chip resistor, a chip capacitor, a land comprised of a circular patterned conductor and serving as a connecting terminal.

The double-sided adhesive sheet 61 is comprised of, for example, a flexible film in the form of a sheet, which film comprises a base (supporting base) of polyester or polyimide and an adhesive layer (adhesive surface) provided thereon, such as a thermosetting rubber adhesive layer, an acrylic adhesive layer, a silicone adhesive layer or the like. If a sheet having a smaller thickness is desired, a baseless double-sided adhesive sheet (sheet consisting only of adhesive layers) manufactured by Teraoka Seisakusho [#7021] may be used, for example.

The separating sheet 62 is separably provided on one of the adhesive layers formed on both sides of the base of the adhesive sheet 61. In the case of an adhesive sheet consisting only of an adhesive layer, the separating sheet 62 is separably provided on one side of the adhesive layer.

On the adhesive surface of the double-sided adhesive sheet 2 on which the electrical components including the IC chip 3 have been stuck in first step, a wire conductor 5, for example, a polyurethane coated wire conductor of 0.14 mm diameter is laid to form an antenna coil 64 of a predetermined pattern, as shown in FIG. 8A [second step]. The wire conductor 5 is laid using, for example, the wiring apparatus shown in FIG. 1. In FIG. 8A, only a wiring head 2 of a wiring apparatus is shown. Illustration or indication of the whole wiring apparatus is omitted.

Figure 8B:
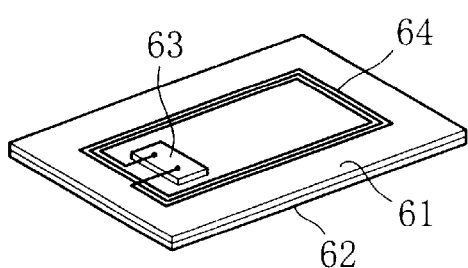
FIG. 8B is a schematic perspective view showing a step of connecting the electrical component and the wire conductor.

After the antenna coil 64 is formed in second step, the wire conductor 5 (antenna coil 64) is electrically connected by soldering the beginning and terminal ends thereof to terminals of the IC chip 63, as shown in FIG. 8B [third step]. If the electrical components such as the IC chip 63 which have been stuck on the double-sided adhesive sheet 61 need to be wired, an electric wiring pattern, i.e., a conductor pattern for electrical connection between electrical components is formed in addition to the antenna coil 64.

In case that the wire conductor 5 for the antenna coil 64 and the wire conductor 5 for the electric wiring pattern are of different kinds, the electric wiring pattern is formed, for example, as follows: After the antenna coil 64 is formed and the beginning and terminal ends thereof are soldered to the IC chip 63, the wire conductor 5 is replaced by the wire conductor 5 for the electric wiring pattern. Then, the latter wire conductor 5 is laid to form the electric wiring pattern, i.e., the conductor pattern for electrical connection, as in the case of forming the antenna coil 64, and the conductor pattern is soldered to terminals of the IC chip 63 and the like and lands. In summary, first and second steps are carried out using the wire conductor 5 for the electric wiring pattern.

Figure 8C:
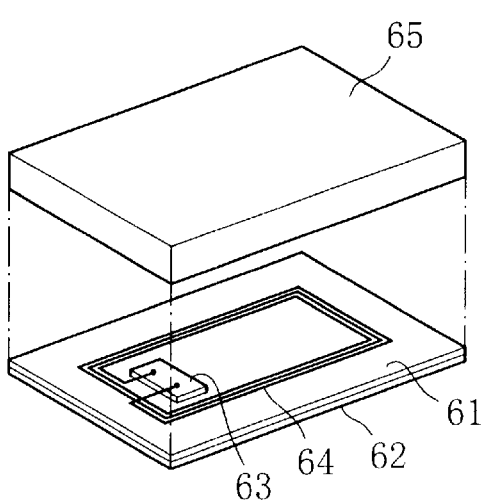
FIG. 8C is a schematic perspective view showing a step of sticking a first card substrate on the adhesive sheet.
Figure 8D:
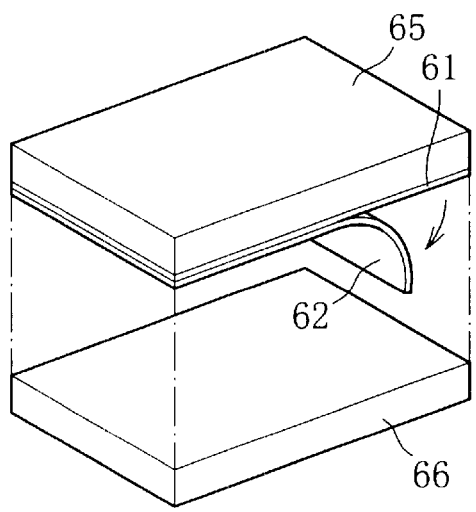
FIG. 8D is a schematic perspective view showing a step of separating a separating sheet from the adhesive sheet.

As described above, a predetermined functional circuit (body of the IC card) as shown in FIG. 8B is formed by placing electrical components such as the IC chip 63 and forming the antenna coil 64 on the adhesive surface of the double-sided adhesive sheet 61. Then, as shown in FIG. 8C, a first card substrate 65 is stuck on the upper surface of the double-sided adhesive sheet 61 [fourth step]. Thereafter, as shown in FIG. 8D, the separating sheet 62 provided on the rear side of the double-sided adhesive sheet 61 is separated, and a second card substrate 66 is stuck on the thus exposed rear-side adhesive surface [fourth step].

Figure 8E:
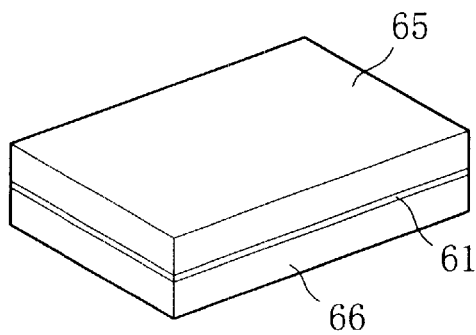
FIG. 8E is a schematic perspective view showing a step of sticking the first and second card substrates on the adhesive sheet.

The card substrates 65, 66 are made of PVC (polyvinyl chloride), PET (polyethylene terephthalate) or the like. It is desirable to use the card substrates 65, 66 a little larger in outer dimensions than the double-sided adhesive sheet 61, so that both card substrates may be combined by spot-welding their peripheral portions with the double-sided adhesive sheet 61 placed therein. Thus, as shown in FIG. 8E, an IC card is completed with the double-sided adhesive sheet 61 sandwiched between the card substrates 65, 66.

If the card substrates 65, 66 and the double-sided adhesive sheet 61 sandwiched therebetween are the same in outer dimensions and formed into a unit, it is desirable to protect the double-sided adhesive sheet 61 by coating all the four end faces of the unit with resin, or by laminating the whole unit with plastic.

According to the above-described IC card manufacturing method where an antenna coil 64 is formed and electrical connection is established between the antenna coil 64 and an IC chip 63 stuck on the adhesive sheet 61 and between electrical components by laying a wire conductor 5 on a double-sided adhesive sheet 61, the process of manufacturing IC cards can be simplified, contributing a reduction in manufacturing cost of IC cards. Since the wire conductor 5 is laid directly on the double-sided adhesive sheet 2, it is easy to densely arrange the coil-parts of the antenna coil 64. Especially when a copper wire with an insulating coating is used as the wire conductor 5, the antenna coil 64 can be formed with its coil-parts being in closely contact with one another, thereby making it possible to improve antenna characteristics. The antenna coil thus formed is satisfactory in respect of bending strength and tensile strength, unlike the antenna coil 64 formed by plating or printing, and is free from fatigue breakage, which may occur to a wire conductor laid using ultrasonic vibration. Thus, reliable IC cards can be manufactured easily, steadily and at low cost.

Further, the card substrates 65, 66 can be combined easily, making use of adhesiveness of the double-sided adhesive sheet 61. Thus, the manufacturing process can be made simpler.

The present invention is not limited to the above-described first and second embodiments.

For example, the first embodiment was described taking an example of forming a planar coil on an adhesive tape. However, the present invention can be applied to forming a desired wiring pattern on an insulated circuit substrate of, for example, paper.phenol, paper.epoxy, glass.epoxy or the like. In that case, silicone adhesive, acrylic adhesive, or rubber adhesive may be directly applied on the insulated circuit substrate. Alternatively, a double-sided adhesive tape applied with adhesive may be stuck on the insulated circuit substrate. The substrate is not limited to a rigid one, but may be a flexible one.

In place of an adhesive layer having adhesiveness in an room temperature, a pressure sensitive adhesive layer may be used, which exhibits adhesiveness when a pressing force is applied by the wiring head 2. Further, a UV (ultraviolet) curing adhesive layer may be used, so that a planar coil or the like may be securely embedded in the adhesive layer by curing the adhesive layer by applying ultraviolet rays after forming the planar coil or the like. Furthermore, thermosetting adhesive may be used.

The wiring pattern and the pitch of the wiring pattern may be determined based on the requirements of a product such as a planar coil. Needless to say, a plurality of planar coils may be formed into a multi-layer structure (laminated structure). The frequency and stroke of the up-and-down motion of the wiring head, the speed of horizontal movement of the wiring head, and the like may be determined based on the diameter of a wire conductor and the like. When the up-and-down motion of the wiring head is synchronized with the horizontal movement of the wiring head 2, the horizontal movement of the wiring head may be prohibited while the wiring head is pressed on the substrate, by providing a torque limiter in the driving mechanism for the XY table. Needless to say, a variety of already proposed mechanical or electrical synchronizing means can be applied to the present invention. However, practically, the apparatus can work satisfactorily without a particular synchronizing means, if the up-and-down motion of the wiring head 2 is made at a speed sufficiently faster than that of the horizontal movement of the wiring head 2.

Regarding the frequency of the up-and-down motion of the wiring head, it is practically enough to determine the same to have a value within the range of about 1.5 Hz to about 500 Hz, while taking account of the feed speed of the wire conductor and the like. Further, a variety of already proposed reciprocating techniques can be applied to means for horizontally moving the wiring head and the like. Further, the substrate may be moved horizontally, in place of moving the wiring head horizontally. In that case, the substrate may be supported on an XY table.

The pattern and the layer structure for a planar coil to be formed by the wiring method of the present invention may be determined based on the requirements of the coil.

As for the up-and-down motion of the wiring head 2, the tip of the nozzle of the wiring head is not required to be brought in contact with the surface of the substrate, as long as a wire conductor drawn out from the tip of the nozzle can be brought into point contact with the substrate surface and securely stuck thereon. Further, the frequency of the up-and-down motion does not need to be constant. That is, the wiring head may be moved up and down in accordance with the curvature, the linear length and the like of a concerned portion of the wiring pattern. Further, the substrate may be moved up and down, in place of moving the wiring head up and down.

In the second embodiment, a card substrate was stuck on each side of a double-sided adhesive sheet. However, an IC card can be manufactured having a card substrate stuck only on that adhesive surface of an adhesive sheet on which electrical components and an antenna coil are stuck and formed, respectively. Further, electrical components and an antenna coil may be stuck and formed, respectively, on an upper surface of a double-sided adhesive sheet, after a card substrate is stuck on the rear side of the double-sided adhesive sheet.

The second embodiment was described, taking an example of manufacturing an IC card provided with an antenna coil. The present invention can be also applied to manufacturing an IC card not provided with an antenna coil. In that case, a wire conductor for connecting electrical components is laid on an adhesive sheet.

Other various modifications can be made to the present invention without departing from the principle thereof.

What is claimed is:

1. A wiring method comprising the steps of:
   (a) forming an adhesive layer on a surface of a substrate;
   (b) providing a three dimension moving mechanism and attaching the mechanism between the substrate and a wiring head so that when the head is operating the mechanism causes a three dimensional motion; and
   (c) sticking a wire conductor on the surface of the substrate by causing a three-dimensional relative movement between the substrate and the wiring head adapted to guide the wire conductor such that the wiring head relatively moves along the adhesive layer formed on the surface of the substrate and the wiring head and the adhesive layer intermittently come close to each other for point contact, wherein the three-dimensional relative movement between the wiring head and the substrate executed in said step (c) includes a relative translational motion between the wiring head and the substrate which is performed along the adhesive layer, and a relative reciprocal motion between the wiring head and the substrate which is performed in a direction of thickness of the substrate.

2. A wiring method according to claim 1, wherein the wire conductor supplied to the wiring head is drawn out from the wiring head by the three-dimensional relative movement between the wiring head and the substrate executed in said step (c).

3. A wiring method according to claim 1, further comprising the steps of:
   (d) providing a second adhesive layer on the wire conductor stuck on the surface of the substrate; and
   (e) sticking a second wire conductor on the second adhesive layer by causing a three-dimensional relative movement between the substrate and the wiring head adapted to guide the second wire conductor, such that the wiring head relatively moves along the second adhesive layer and the wiring head and the second adhesive layer intermittently come close to each other for point contact.

4. A wiring method according to claim 3, wherein:
   the three-dimensional relative movement between the wiring head and the substrate executed in said step (c) includes a relative translational motion between the wiring head and the substrate which is performed along the adhesive layer, and a relative reciprocal motion between the wiring head and the substrate which is performed in a direction of thickness of the substrate, the relative translational motion being executed in accordance with a first two-dimensional pattern, so that a first wire-conductor pattern corresponding to the first two-dimensional pattern is formed on the surface of the substrate;

in said step (d), the second adhesive layer is formed on the first wire-conductor pattern; and in said step (e), a relative translational motion between the substrate and the wiring head adapted to guide the second wire conductor is executed in accordance with a second two-dimensional pattern, so that a second wire-conductor pattern corresponding to the second two-dimensional pattern is formed on the second adhesive layer.

5. A wiring method according to claim 3, wherein in said step (d), an adhesive sheet is stuck on the first wire-conductor pattern to form the second adhesive layer.

6. A wiring method according to claim 3, wherein conductors with an insulating coating are used as the wire conductor and the second wire conductor.

* * * * *